United States Patent

Takeshima

[11] Patent Number: 5,969,993
[45] Date of Patent: Oct. 19, 1999

[54] METHOD OF RESTORING DATA IN NON-VOLATILE SEMICONDUCTOR MEMORY

[75] Inventor: Toshio Takeshima, Tokyo, Japan

[73] Assignee: NEC Corporation, Tokyo, Japan

[21] Appl. No.: 09/102,074

[22] Filed: Jun. 22, 1998

[30] Foreign Application Priority Data

Jun. 20, 1997 [JP] Japan ................................. 9-164795

[51] Int. Cl.$^6$ ................................................. G11C 16/06
[52] U.S. Cl. ............................. 365/185.29; 365/185.28; 365/185.32; 365/185.33; 365/185.3; 365/185.24
[58] Field of Search ..................... 365/185.29, 185.28, 365/185.32, 185.33, 185.3, 185.24, 185.01

[56] References Cited

U.S. PATENT DOCUMENTS

| | | | |
|---|---|---|---|
| 5,293,212 | 3/1994 | Yamamoto et al. | 365/185.18 |
| 5,467,306 | 11/1995 | Kaya et al. | 365/185.2 |
| 5,576,992 | 11/1996 | Mehrad | 365/185.28 |
| 5,596,528 | 1/1997 | Kaya et al. | 365/185.24 |
| 5,629,898 | 5/1997 | Idei et al. | 365/233 |
| 5,768,194 | 6/1998 | Matsubara et al. | 365/185.33 |
| 5,835,409 | 11/1998 | Lambertson | 365/185.15 |

FOREIGN PATENT DOCUMENTS 8-77785  3/1996  Japan .
8-249893  9/1996  Japan .

*Primary Examiner*—Viet Q. Nguyen
*Attorney, Agent, or Firm*—Young & Thompson

[57] ABSTRACT

Disclosed is a method of restoring data in a non-volatile semiconductor memory which has a memory cell array that a plurality of electrically programmable memory cells to be set of several threshold voltages are matrix-disposed, a data erasing means that divides the memory cell array into several blocks and erases in the lump data stored in memory cells included in the divided block, a data writing means that writes data into the memory cells, a data reading means that reads out data from the memory cells, and a control means that controls the operations of the data erasing means, data writing means and data reading means, wherein the non-volatile semiconductor memory has a function that detects the deterioration of data stored in the memory cells and then restores it, the method having the steps of: detecting the data-deterioration state of memory cells included in the block; conducting a light erasing operation with a threshold voltage change smaller than that of an ordinary erasing operation to an erase block including a memory cell with a data-deterioration state that cannot be restored by additional writing; then detecting the data-deterioration state of the memory cells again; and restoring data of a memory cell that a data deterioration is detected.

40 Claims, 7 Drawing Sheets

WC : WRITE CIRCUIT
SA : SENSE AMPLIFIER

CONCEPT FOR FIRST ADDRESS, SECOND ADDRESS

METHOD OF RESTORING DATA IN NON-VOLATILE SEMICONDUCTOR MEMORY

FIELD OF THE INVENTION

This invention relates to a method of restoring data in a non-volatile semiconductor memory, and more particularly to, a method of restoring data in an electrically programmable non-volatile semiconductor memory.

BACKGROUND OF THE INVENTION

In an electrically programmable non-volatile semiconductor memory, such as a flash memory, a logic state is stored with a threshold voltage (hereinafter referred to as 'cell Vt') of a memory cell. For example, in storing binary information, data "0" can be represented by a cell Vt lowered by erase operation and data "1" can be represented by a cell Vt raised by write operation. Also, multi-valued information is stored in like manner. For example, in storing ternary information, data "0" can be represented by a cell Vt lowered by erase operation, and data "1", "2" can be represented by cell Vt's raised stepwise by write operation. On the contrary, in storing binary information, data "1" can be represented by a cell Vt raised by erase operation and data "0" can be represented by a cell Vt lowered by write operation. In like manner, in storing ternary information, data "2" can be represented by a cell Vt raised by erase operation, and data "1", "0" can be represented by cell Vt's lowered stepwise by write operation. The former example is taken for a channel hot electron (CHE) write type memory cell, and the latter example is taken for a Faurer-Nordheim (FN) write type memory cell.

In such a flash memory, in general, writing of data is conducted by one bit while checking a write state (cell Vt) and erasing of data is conducted by a group of memory cells (block) more than that of writing while checking an erase state (cell Vt). In flash memories, cell Vt's are properly set corresponding to data "0", "1" and "2" in writing of data. However, a cell Vt may be changed by various disturbances and a leakage current from a charge-storage layer, thereby deteriorating or destroying the stored data.

Several methods of restoring a cell Vt to the original value (cell Vt just after writing) while detecting a change (deterioration) of cell Vt to prevent stored data from being destroyed have been proposed.

For example, Japanese patent application laid-open No.8-77785(1996) discloses a method and circuit that, in writing multi-valued information, a change in cell Vt (deterioration of stored data) is detected by applying different voltages to a word line and rewriting of data is then conducted to restore a cell Vt to the original value. Also, Japanese patent application laid-open No.8-249893(1996) discloses a method and circuit that, in writing multi-valued information, several detecting means for checking the insufficiency or excess of writing after the write operation are provided, and additional writing is conducted to a insufficient write cell or rewriting or additional erasing is conducted to an excessive write cell after erasing the memory cell.

Furthermore, Japanese patent application laid-open No.8-235887(1996) discloses a method that, in storing binary information, the deterioration of data stored in memory cell is detected by using two reference levels for verification provided other than a normal reference value for reading out, and the contents are transferred to a register and then rewriting is conducted when it is judged that the data restoring is necessary.

However, the conventional data restoring methods have some problems. First, the chip area has to be increased due to the excessive writing that requires registers of a same number as the number of the memory cells of an erase block. Second, the data restoring speed has to be reduced due to the data transfer time to the registers. Namely, when a memory cell of excessive writing is detected, all memory cells in an erase block have to be erased in a normal manner (initialization of stored data) and then the data (data to be rewritten) stored in the original memory cells have to be temporarily transferred outside the memory cells before the rewriting.

SUMMARY OF THE INVENTION

Accordingly, it is an object of the invention to provide a method of restoring data in a non-volatile semiconductor memory that the chip area can be reduced.

It is a further object of the invention to provide a method of restoring data in a non-volatile semiconductor memory that the data restoring speed can be enhanced.

According to the invention, a method of restoring data in a non-volatile semiconductor memory which comprises a memory cell array that a plurality of electrically programmable memory cells to be set of several threshold voltages are matrix-disposed, a data erasing means that divides the memory cell array into several blocks and erases in the lump data stored in memory cells included in the divided block, a data writing means that writes data into the memory cells, a data reading means that reads out data from the memory cells, and a control means that controls the operations of the data erasing means, data writing means and data reading means, wherein the non-volatile semiconductor memory has a function that detects the deterioration of data stored in the memory cells and then restores it, comprises the steps of:

detecting the data-deterioration state of memory cells included in the block;

conducting a light erasing operation with a threshold voltage change smaller than that of an ordinary erasing operation to an erase block including a memory cell with a data-deterioration state that cannot be restored by additional writing;

then detecting the data-deterioration state of the memory cells again; and restoring data of a memory cell that a data deterioration is detected.

According to another aspect of the invention, a method of restoring data in a non-volatile semiconductor memory which comprises a memory cell array that a plurality of electrically programmable memory cells to be set of several threshold voltages are matrix-disposed, a data erasing means that divides the memory cell array into several first blocks and erases in the lump data stored in memory cells included in the divided first block, a plurality of data writing means that further divide the first block into several second blocks and write data into the memory cells included in the second block, a plurality of data reading means that read out data from the memory cells included in the second block, and a control means that controls the operations of the data erasing means, data writing means and data reading means, wherein the non-volatile semiconductor memory has a function that detects the deterioration of data stored in the memory cells and then restores it, comprises the steps of:

detecting the data-deterioration state of memory cells included in the second block;

conducting a data restoring operation by additional writing to a memory cell with a data-deterioration state that can be restored by additional writing;

conducting the data restoring operation by additional writing for the second block to second blocks included in the first block;

conducting a light erasing operation with a threshold voltage change smaller than that of an ordinary erasing operation to the first block when the first block includes a memory cell with a data-deterioration state that cannot be restored by additional writing;

then detecting the data-deterioration state of the memory cells again; and repeating the data restoring operation of a memory cell that a data deterioration is detected.

According to another aspect of the invention, a method of restoring data in a non-volatile semiconductor memory which comprises a memory cell array that a plurality of electrically programmable memory cells to be set of several threshold voltages are matrix-disposed, a data erasing means that divides the memory cell array into several blocks and erases in the lump data stored in memory cells included in the divided block, a plurality of data writing means that write data into the memory cells included in the divided block, a plurality of data reading means that read out data from the memory cells included in the divided block, and a control means that controls the operations of the data erasing means, data writing means and data reading means, wherein the non-volatile semiconductor memory has a function that detects the deterioration of data stored in the memory cells and then restores it, comprises the steps of:

detecting the data-deterioration state of memory cells included in the block;

conducting a data restoring operation by additional writing to a memory cell with a data-deterioration state that can be restored by additional writing;

conducting a light erasing operation with a threshold voltage change smaller than that of an ordinary erasing operation to the block when the block includes a memory cell with a data-deterioration state that cannot be restored by additional writing;

then detecting the data-deterioration state of the memory cells again; and repeating the data restoring operation of a memory cell that a data deterioration is detected.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a method of restoring data in a non-volatile semiconductor memory in the preferred embodiments, the aforementioned conventional cell data restoring method will be explained below.

An example of the conventional cell data restoring method as well as an example of the transferring of cell Vt in restoring a deterioration of data will be explained in FIGS. 1 and 2, respectively.

Figure 1:
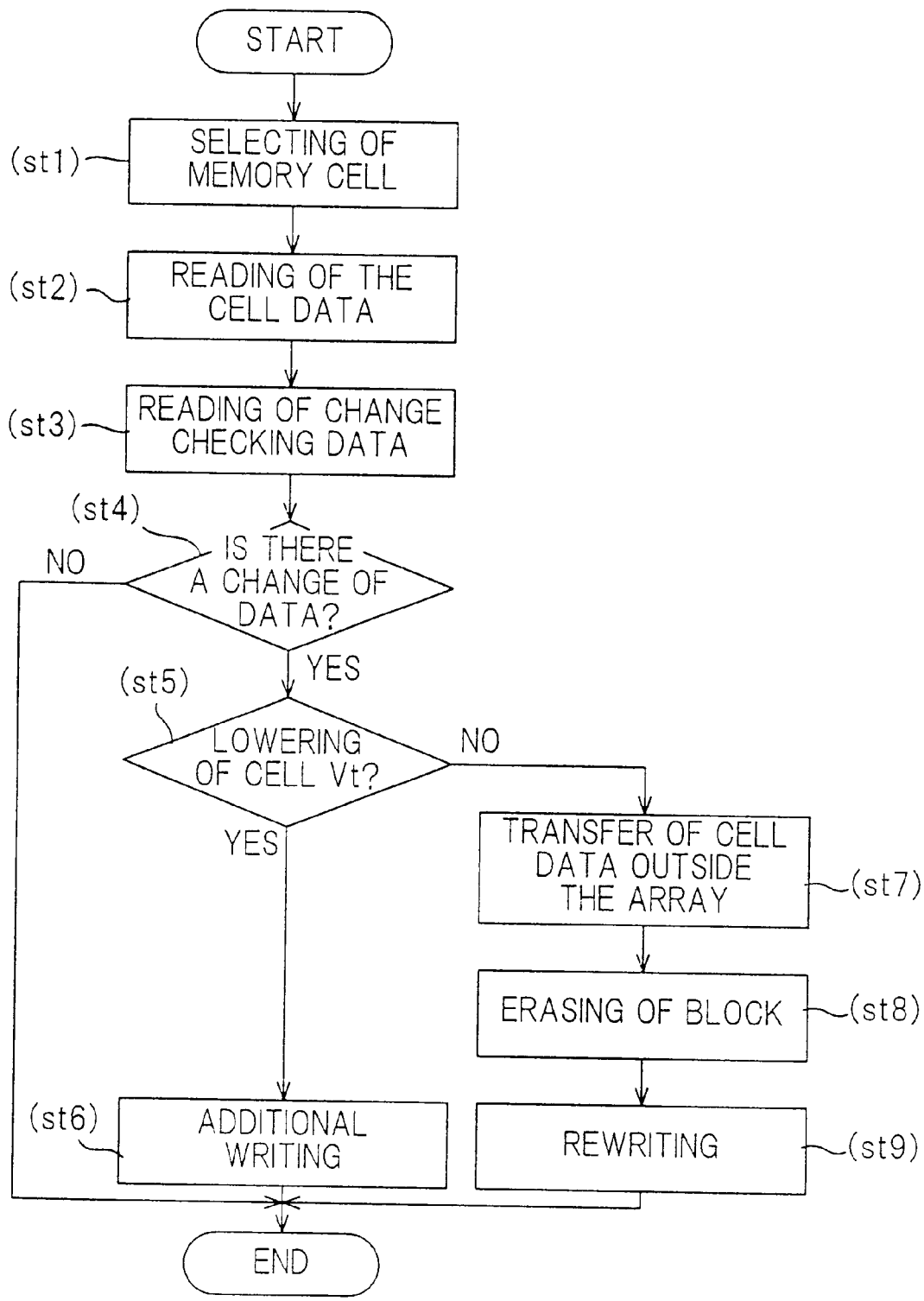
FIG. 1 is a flow chart showing a conventional cell data restoring method.

Referring to FIG. 1, data stored in all memory cells included in an erase block are first read out by using a cell Vt judgement level VRi (i=0, 1) (steps 1 and 2). Then, change checking data are read out by using a cell Vt judgement level VRi0, VRi1 (i=0 to 2) (steps 3). Then, it is checked whether a change in data exists or not (step 4). When no change in data is detected, the restoring operation ends. When a change in data is detected, the direction of the change of cell Vt is checked (step 5). Following this, when the data can be restored by additional writing (in this example, in case of lowering of cell Vt), the additional writing is conducted (step 6). When the data cannot be restored by additional writing (in this example, in case of an increase of cell Vt), the stored data read out at step 2 is transferred to a register outside the cell array and then the block is erased (steps 7 and 8). Then, rewriting of data is conducted according to the data transferred (step 9).

Figure 2:
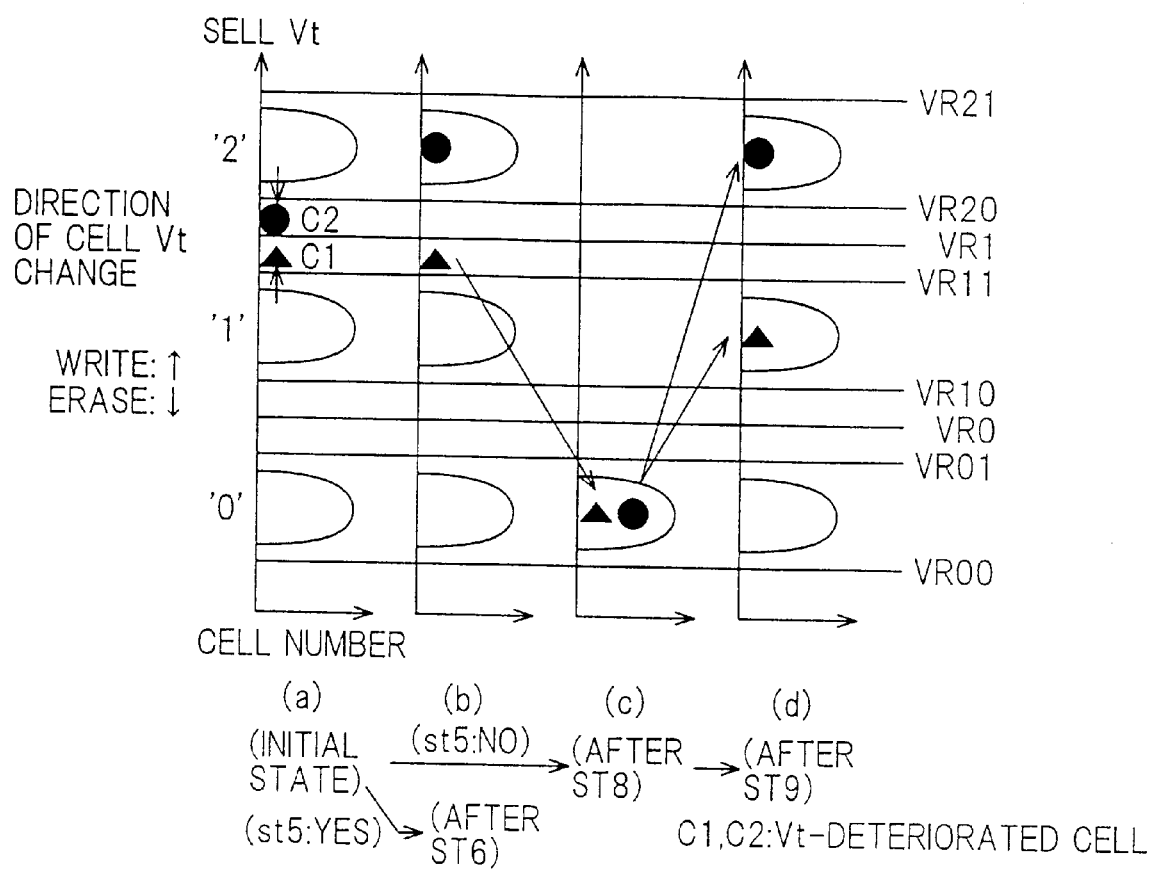
FIG. 2 is an illustration showing states in restoring cell data in the conventional cell data restoring method.

Referring to FIG. 2, 'C1' represents a memory cell that the cell Vt is raised from data "1", and 'C2' represents a memory cell that the cell Vt is lowered from data "2". In this case, when only the memory cell C2 is data-deteriorated, the data restoring is conducted by additional writing to raise the cell Vt to place it in the original distribution (between VR20 and VR21). When the memory cell C1 is data-deteriorated, data stored in all memory cells of an erase block are transferred to registers of a same number as the memory cells of the erase block and then are erased and the cell Vt is shifted to the region of data "0". Thereafter, rewriting for all the memory cells in the clock is conducted to restore the data.

Figure 3:
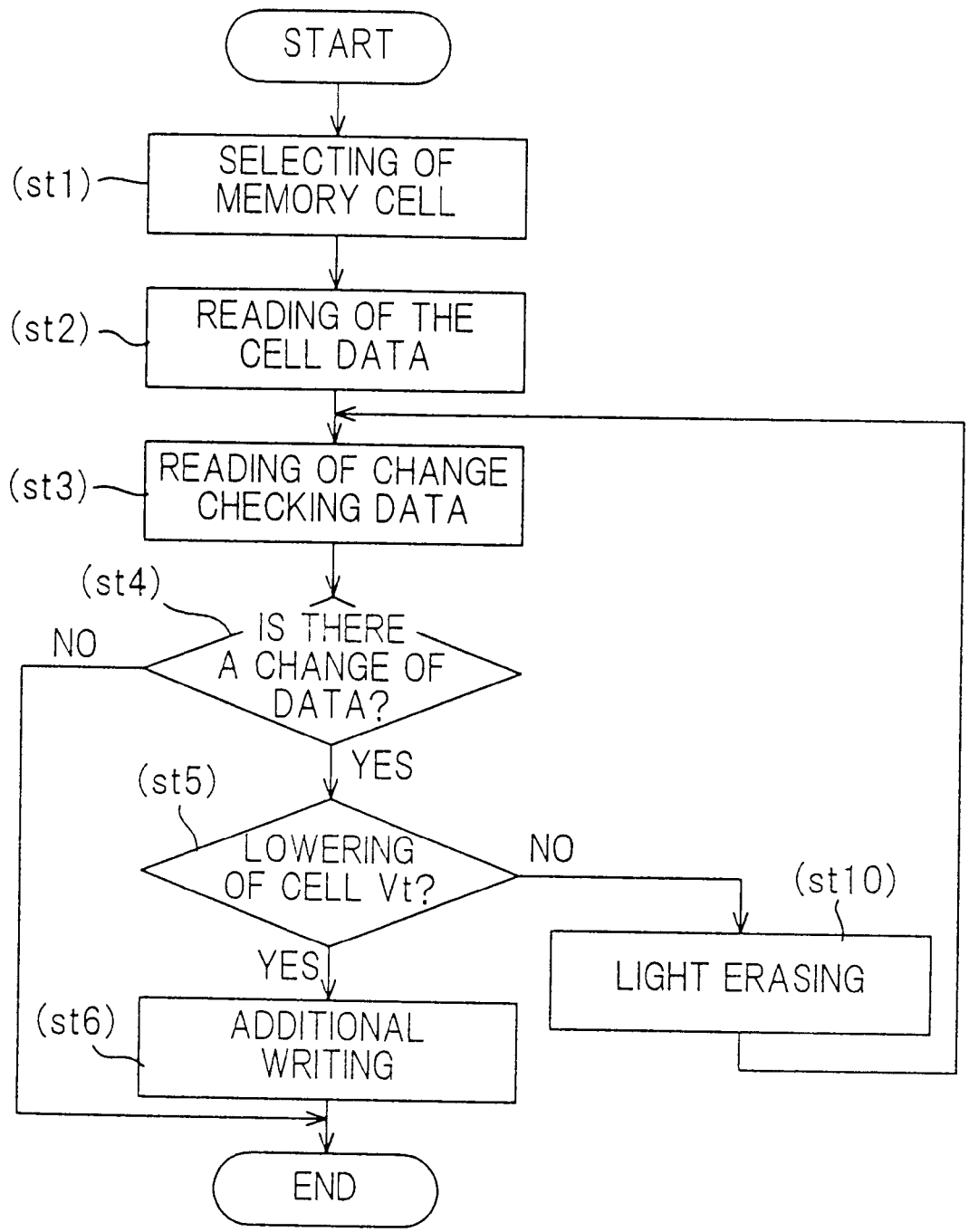
FIG. 3 is a flow chart showing a method of restoring data in a non-volatile semiconductor memory in a first preferred embodiment according to the invention.

Next, a method of restoring data in a non-volatile semiconductor memory in the first preferred embodiment will be explained in FIGS. 3 and 4. FIG. 3 shows the process of a cell data restoring operation according to the invention.

The process of the invention in FIG. 3 is different from the conventional process in FIG. 1 in that, when data deterioration due to an increase in cell Vt is detected (when judged as 'NO' in step 5), instead of the block erasing and rewriting (steps 7 to 9 in FIG. 1), light erasing (step 10) is conducted and then the change checking of cell data (step 3) is conducted again.

Figure 4:
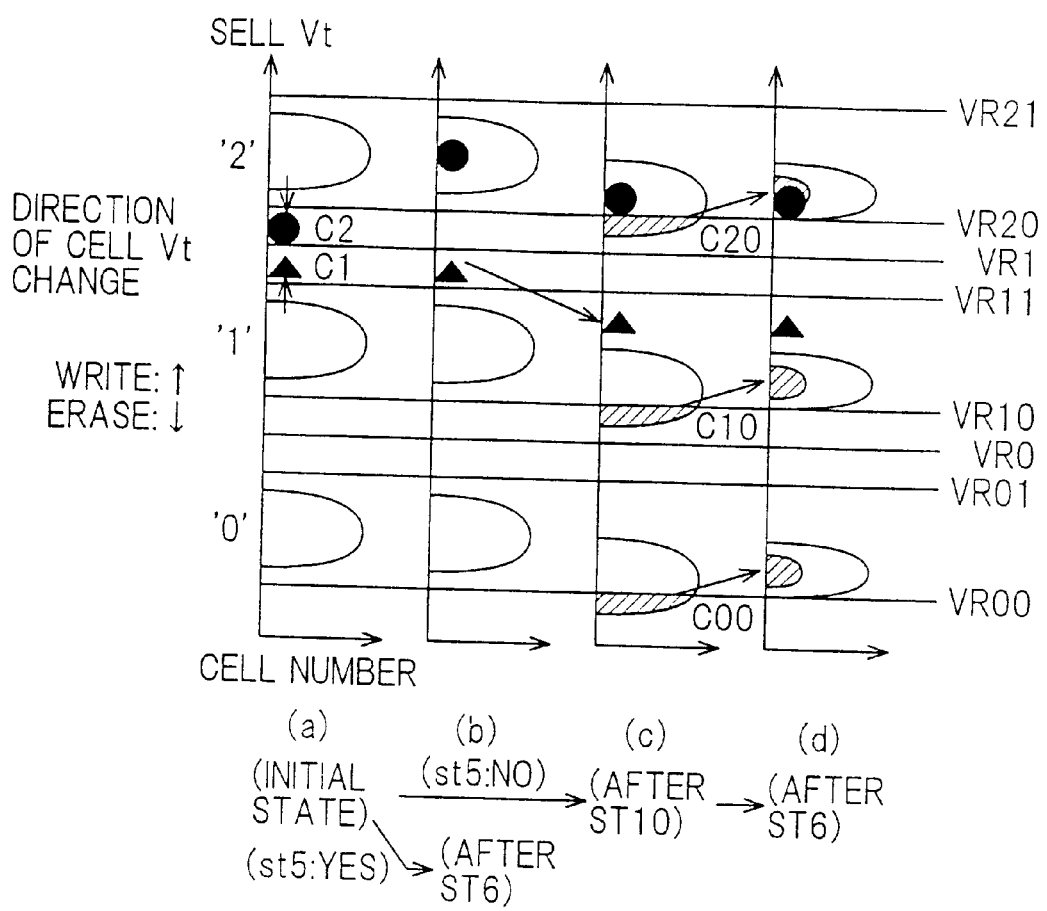
FIG. 4 is an illustration showing states in restoring cell data in the first embodiment.

An example of data restoring process in the first embodiment will be illustrated in FIG. 4 that is drawn contrasting with the conventional process in FIG. 2. Like FIG. 2, 'C1' represents a memory cell that the cell Vt is raised from data "1", and 'C2' represents a memory cell that the cell Vt is lowered from data "2". The cell Vt distributions of cells in a cell array are shown in FIG. 4, wherein a series of restoring states are shown by one illustration so that the restoring process can be easily seen. A non-volatile semiconductor memory concerned is restored in the order of (a), (b), (c) and (d) in FIG. 4. Meanwhile, the first embodiment is applied to a memory cell of channel hot electron (CHE) write type that is described in prior arts. In such a type, additional writing is performed by injecting electron to a floating gate of memory cell transistor and only raising of cell Vt is allowed.

The data deterioration of a memory cell C2 shown by (a) in FIG. 4 is, like the conventional process, restored by raising the cell Vt by additional writing to place it in the original distribution (between VR20 and VR21) ((b) in FIG. 4).

When the data deterioration of a memory cell C1 is included, after data-restoring by the above-mentioned additional writing, the light erasing is conducted to all memory cells in an erase block so as to lower the cell Vt's of the memory cells, thereby placing the cell Vt of the memory cell C1 in the original distribution (between VR10 and VR11) to restore the data of the memory cell C1 ((c) in FIG. 4). At this time, the cell Vt's of the other memory cells in the erase block are also lowered. Therefore, the cell Vt's can be shifted to a region lower than a normal data region (C00, C10, C20). For this shifting, the change of cell Vt is checked again and then additional data restoring (raising of cell Vt) is conducted to a memory cell (C00, C10, C20) that needs to restore ((d) in FIG. 4).

Though the cell Vt amount (per one time) to be changed by the light erasing is not shown in FIGS. 3 and 4, it is limited to such a degree that data to be originally normal can be restored by the next restoring operation. In other words, it is such a degree that the cell Vt's of all memory cells can be lowered not exceeding the cell Vt judgement level (threshold judgement level) VR0, VR1 in reading data normally. Therefore, when the memory cell C1 cannot be restored by one-time light erasing, the above-mentioned additional writing is conducted and then the light erasing is conducted again after returning the cell Vt's of memory cells storing data to be originally normal to the former distribution region. By repeating such an operation, the data stored in memory cell can be restored.

Meanwhile, "cell Vt judgement level (threshold judgement level)' means a reference voltage level used to detect a threshold state while discriminating it, for example, three threshold states 0, 1 and 2 in case of three threshold voltages to be set.

Also, in 'reading data normally', for example, the following two methods may be used.

The first is a method described in Japanese patent application laid-open No. 8-235887 as prior art. In this method, three threshold states are read out by varying a voltage to be applied to the control gate (memory word) of a memory transistor. In this case, VR0, VR1 correspond to voltages applied to the control gate that are set to be at the center of two threshold voltage states. In Japanese patent application laid-open No. 8-235887, Vrot in FIG. 2 corresponds to this.

The second is a method that a constant voltage is applied to the control gate and a difference in current to flow into a memory transistor, which depends on a threshold voltage state, is detected by an sense amplifier. In this case, the cell Vt judgement level is a comparison reference voltage to be applied to the sense amplifier and does not directly relate to the threshold voltage.

In the first embodiment, taken is an example that the data deterioration of the memory cell C1 is included. However, when only the memory cell C1 is data-deteriorated, only the restoring operations shown by (b), (c) and (d) in FIG. 4 have to be conducted.

The method of restoring data in a non-volatile semiconductor memory in the first embodiment can bring the following advantages.

The register for temporarily transferring stored data, the transfer operation and the normal erase operation (step 8 in FIG. 1) in the conventional restoring methods can be omitted because data stored in memory cell are not destroyed. Therefore, the chip area can be reduced by that much and the high-speed data restoring can be performed.

Also, a cell Vt deterioration margin (VRi01–VRi0, VRi1–VRi11 (i=0 to 2)) from data writing operation to data restoring operation can be obtained, thereby reducing the frequency of data restoring operations.

Further, due to the setting of the three threshold voltages, the advantage becomes greater than that in two threshold voltages.

Figure 5:
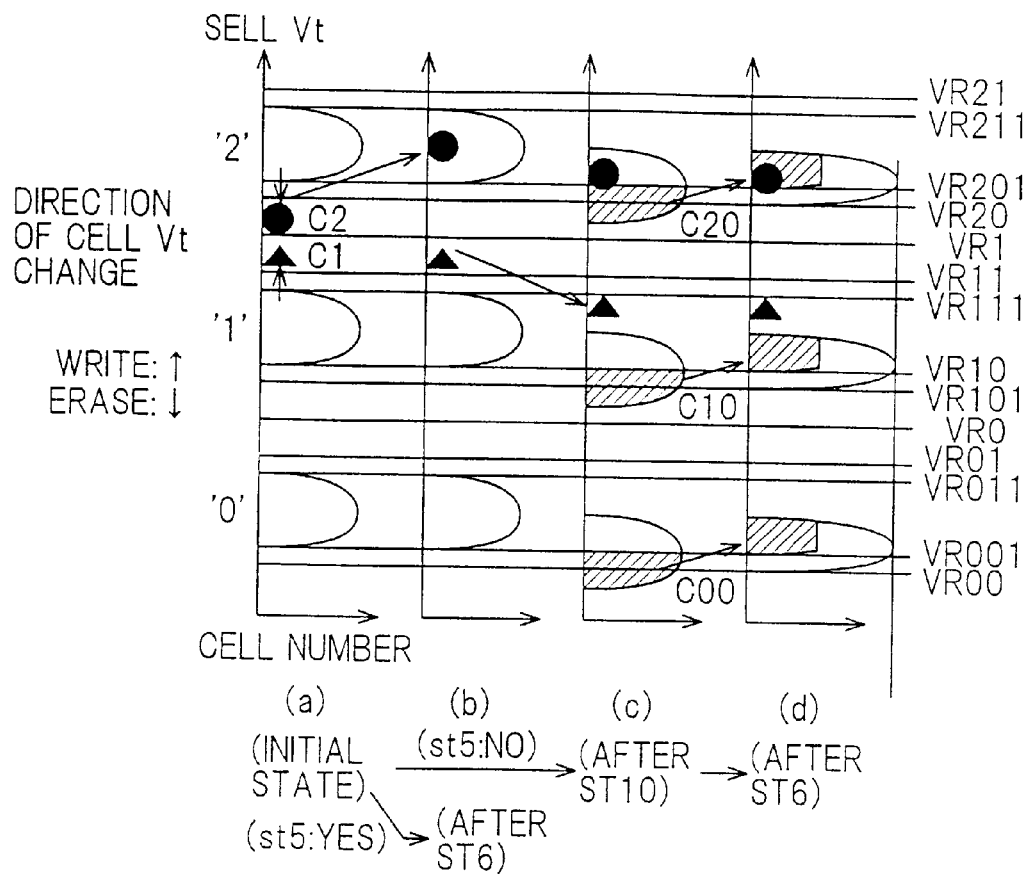
FIG. 5 is an illustration showing states in restoring cell data in a second preferred embodiment according to the invention.

A method of restoring data in a non-volatile semiconductor memory in the second preferred embodiment will be explained in FIG. 5. The method of the second embodiment is different from that of the first embodiment in that cell Vt judgement levels (VRi01, VRi11 (i=0 to 2) in detecting the data deterioration are differed from cell Vt judgement levels (VRi1, VRi1 (i=0 to 2) in writing data. The other conditions are analogous to those in the first embodiment shown in FIG. 4.

Figure 6:
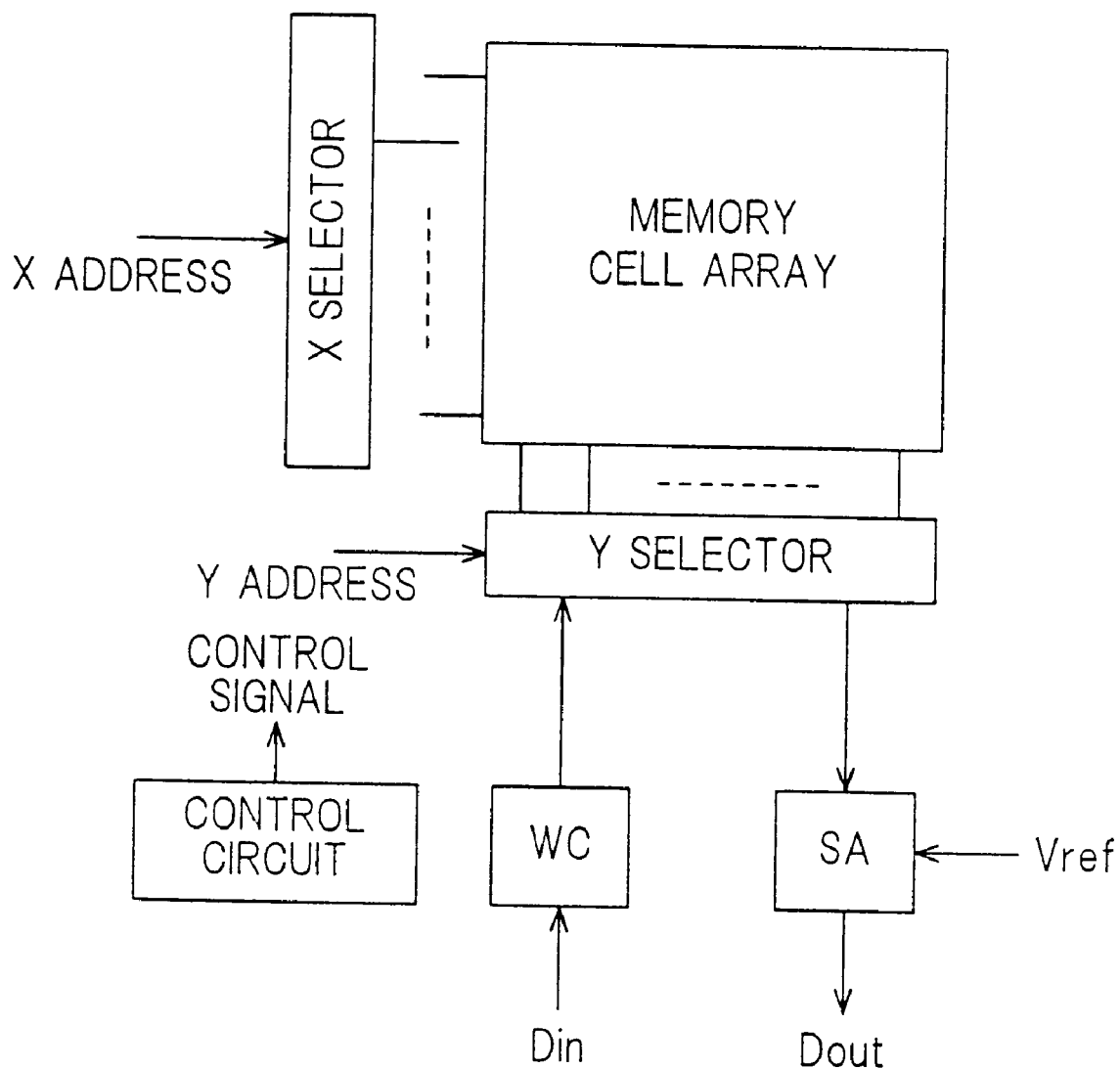
FIG. 6 is a block diagram showing a non-volatile semiconductor memory to be used relating to the second embodiment.
Figure 7:
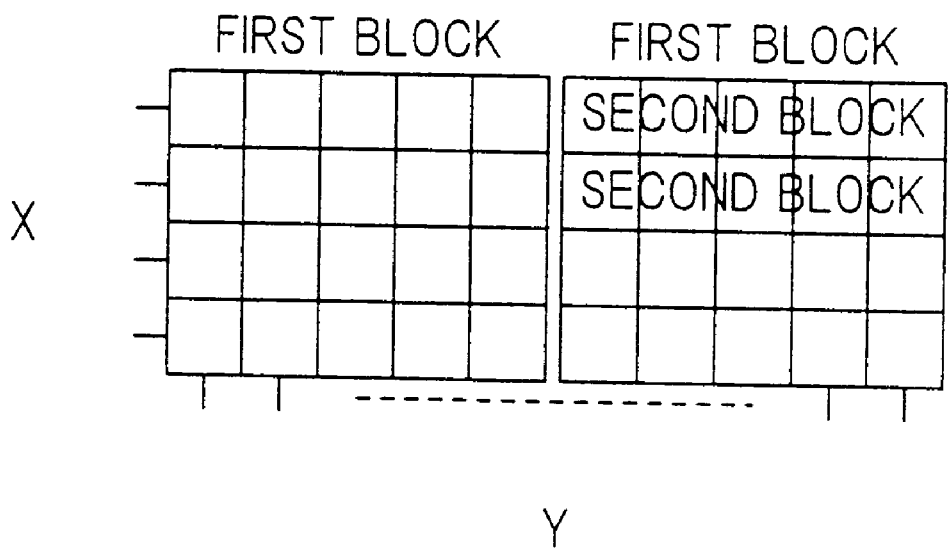
FIG. 7 is an illustration showing the relation between a first block and a second block in a memory cell array in the second embodiment.

FIG. 6 shows a non-volatile semiconductor memory relating to the second embodiment. In this memory, the detection (re-detection) of deterioration state is conducted by using a sense amplifier (reading means) SA. The light erasing operation, data erasing operation and restoring operation are conducted by a control signal from a control means. Voltage is applied by a data erasing means. FIG. 7 shows the relation between a first block and a second block in a memory cell array.

Meanwhile, in this invention, another embodiment other than the first and second embodiments can be also taken. For example, the erase block can be divided into several smaller blocks, and means for writing/reading in the lump the stored data to and from several memory cells included in the divided blocks can be provided. In operation, after detecting the data deterioration state of the memory cells included in the divided blocks, a memory cell that the data can be restored by the additional writing is restored by the additional writing, and the data restoring operation by the additional writing is conducted to the divided blocks included in the erase block. When a memory cell that cannot be restored by the additional writing exists in the erase block, light erasing with a threshold voltage change smaller than that of ordinary erasing is conducted to the erase block and then the data deterioration state of the memory cells is checked again. Thus, the restoring operation of the memory cell data that is detected of data deterioration can be repeated.

Furthermore, the memory cell array can be divided into several erase blocks, and means for writing/reading in the lump the stored data to and from several memory cells included in the divided erase blocks can be provided. In operation, after detecting the data deterioration state of the memory cells included in the divided erase blocks, a memory cell that the data can be restored by the additional writing is restored by the additional writing. When a memory cell that cannot be restored by the additional writing exists in the erase block, light erasing with a threshold voltage change smaller than that of ordinary erasing is conducted to the erase block and then the data deterioration state of the memory cells is checked again. Thus, the restoring operation of the memory cell data that is detected of data deterioration can be repeated.

Also, the number, position, and shape of components to be used in this invention are not limited to those in the above embodiments. Namely, they can be optionally changed into a number, position and shape suitable for reducing the invention into practice.

Meanwhile, in FIGS. 1 to 5, like components are indicated by like reference numerals.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method of restoring data in a non-volatile semiconductor memory which comprises a memory cell array that a plurality of electrically programmable memory cells to be set of several threshold voltages are matrix-disposed, a data erasing means that divides said memory cell array into several blocks and erases in the lump data stored in memory cells included in the divided block, a data writing means that writes data into said memory cells, a data reading means that reads out data from said memory cells, and a control means that controls the operations of said data erasing means, data writing means and data reading means, wherein said non-volatile semiconductor memory has a function that detects the deterioration of data stored in the memory cells and then restores it, comprising the steps of:

detecting the data-deterioration state of memory cells included in said block;

conducting a light erasing operation with a threshold voltage change smaller than that of an ordinary erasing operation to an erase block including a memory cell with a data-deterioration state that cannot be restored by additional writing;

then detecting the data-deterioration state of the memory cells again; and restoring data of a memory cell that a data deterioration is detected.

2. A method of restoring data in a non-volatile semiconductor memory, according to claim 1, wherein:

said light erasing operation is conducted by applying a threshold voltage change lower than a difference between a first cell threshold judgement level in reading data normally and a second cell threshold judgement level in detecting the data deterioration to the memory cell.

3. A method of restoring data in a non-volatile semiconductor memory, according to claim 2, wherein:

said second cell threshold judgement level in detecting the data deterioration is set to lie between a third cell threshold judgement level in writing data and said first cell threshold judgement level in reading data normally.

4. A method of restoring data in a non-volatile semiconductor memory which comprises a memory cell array that a plurality of electrically programmable memory cells to be set of several threshold voltages are matrix-disposed, a data erasing means that divides said memory cell array into several first blocks and erases in the lump data stored in memory cells included in the divided first block, a plurality of data writing means that further divide said first block into several second blocks and write data into said memory cells included in said second block, a plurality of data reading means that read out data from said memory cells included in said second block, and a control means that controls the operations of said data erasing means, data writing means and data reading means, wherein said non-volatile semiconductor memory has a function that detects the deterioration of data stored in the memory cells and then restores it, comprising the steps of:

detecting the data-deterioration state of memory cells included in said second block;

conducting a data restoring operation by additional writing to a memory cell with a data-deterioration state that can be restored by additional writing;

conducting said data restoring operation by additional writing for said second block to second blocks included in said first block;

conducting a light erasing operation with a threshold voltage change smaller than that of an ordinary erasing operation to said first block when said first block includes a memory cell with a data-deterioration state that cannot be restored by additional writing;

then detecting the data-deterioration state of the memory cells again; and repeating the data restoring operation of a memory cell that a data deterioration is detected.

5. A method of restoring data in a non-volatile semiconductor memory, according to claim 4, wherein:

said light erasing operation is conducted by applying a threshold voltage change lower than a difference between a first cell threshold judgement level in reading data normally and a second cell threshold judgement level in detecting the data deterioration to the memory cell.

6. A method of restoring data in a non-volatile semiconductor memory, according to claim 5, wherein:

said second cell threshold judgement level in detecting the data deterioration is set to lie between a third cell threshold judgement level in writing data and said first cell threshold judgement level in reading data normally.

7. A method of restoring data in a non-volatile semiconductor memory which comprises a memory cell array that a plurality of electrically programmable memory cells to be set of several threshold voltages are matrix-disposed, a data erasing means that divides said memory cell array into several blocks and erases in the lump data stored in memory cells included in the divided block, a plurality of data writing means that write data into said memory cells included in the divided block, a plurality of data reading means that read out data from said memory cells included in the divided block, and a control means that controls the operations of said data erasing means, data writing means and data reading means, wherein said non-volatile semiconductor memory has a function that detects the deterioration of data stored in the memory cells and then restores it, comprising the steps of:

detecting the data-deterioration state of memory cells included in said block;

conducting a data restoring operation by additional writing to a memory cell with a data-deterioration state that can be restored by additional writing;

conducting a light erasing operation with a threshold voltage change smaller than that of an ordinary erasing operation to said block when said block includes a memory cell with a data-deterioration state that cannot be restored by additional writing;

then detecting the data-deterioration state of the memory cells again; and repeating the data restoring operation of a memory cell that a data deterioration is detected.

8. A method of restoring data in a non-volatile semiconductor memory, according to claim 7, wherein:

said light erasing operation is conducted by applying a threshold voltage change lower than a difference between a first cell threshold judgement level in reading data normally and a second cell threshold judgement level in detecting the data deterioration to the memory cell.

9. A method of restoring data in a non-volatile semiconductor memory, according to claim 8, wherein:

said second cell threshold judgement level in detecting the data deterioration is set to lie between a third cell threshold judgement level in writing data and said first cell threshold judgement level in reading data normally.

10. A method of restoring data in a non-volatile semiconductor memory, according to claim 1, wherein:

said threshold voltages are set to be more than three.

11. A method of restoring data in a non-volatile semiconductor memory, according to claim 2, wherein:

said threshold voltages are set to be more than three.

12. A method of restoring data in a non-volatile semiconductor memory, according to claim 3, wherein:

said threshold voltages are set to be more than three.

13. A method of restoring data in a non-volatile semiconductor memory, according to claim 4, wherein:

said threshold voltages are set to be more than three.

14. A method of restoring data in a non-volatile semiconductor memory, according to claim 5, wherein:

said threshold voltages are set to be more than three.

15. A method of restoring data in a non-volatile semiconductor memory, according to claim 6, wherein:

said threshold voltages are set to be more than three.

16. A method of restoring data in a non-volatile semiconductor memory, according to claim 7, wherein:

said threshold voltages are set to be more than three.

17. A method of restoring data in a non-volatile semiconductor memory, according to claim 8, wherein:

said threshold voltages are set to be more than three.

18. A method of restoring data in a non-volatile semiconductor memory, according to claim 9, wherein:

said threshold voltages are set to be more than three.

19. A method of restoring data in a non-volatile semiconductor memory, according to claim 4, wherein:

said data writing means writes in the lump data to be stored.

20. A method of restoring data in a non-volatile semiconductor memory, according to claim 5, wherein:

said data writing means writes in the lump data to be stored.

21. A method of restoring data in a non-volatile semiconductor memory, according to claim 6, wherein:

said data writing means writes in the lump data to be stored.

22. A method of restoring data in a non-volatile semiconductor memory, according to claim 7, wherein:

said data writing means writes in the lump data to be stored.

23. A method of restoring data in a non-volatile semiconductor memory, according to claim 8, wherein:

said data writing means writes in the lump data to be stored.

24. A method of restoring data in a non-volatile semiconductor memory, according to claim 9, wherein:

said data writing means writes in the lump data to be stored.

25. A method of restoring data in a non-volatile semiconductor memory, according to claim 4, wherein:

said data reading means reads out in the lump data stored.

26. A method of restoring data in a non-volatile semiconductor memory, according to claim 5, wherein:

said data reading means reads out in the lump data stored.

27. A method of restoring data in a non-volatile semiconductor memory, according to claim 6, wherein:

said data reading means reads out in the lump data stored.

28. A method of restoring data in a non-volatile semiconductor memory, according to claim 7, wherein:

said data reading means reads out in the lump data stored.

29. A method of restoring data in a non-volatile semiconductor memory, according to claim 8, wherein:

said data reading means reads out in the lump data stored.

30. A method of restoring data in a non-volatile semiconductor memory, according to claim 9, wherein:

said data reading means reads out in the lump data stored.

31. A method of restoring data in a non-volatile semiconductor memory, according to claim 4, wherein:

said step of detecting the data-deterioration state is conducted to all memory cells included in said second block.

32. A method of restoring data in a non-volatile semiconductor memory, according to claim 5, wherein:

said step of detecting the data-deterioration state is conducted to all memory cells included in said second block.

33. A method of restoring data in a non-volatile semiconductor memory, according to claim 6, wherein:

said step of detecting the data-deterioration state is conducted to all memory cells included in said second block.

34. A method of restoring data in a non-volatile semiconductor memory, according to claim 4, wherein:

said data restoring operation by additional writing is conducted to all second blocks included in said first block.

35. A method of restoring data in a non-volatile semiconductor memory, according to claim 5, wherein:

said data restoring operation by additional writing is conducted to all second blocks included in said first block.

36. A method of restoring data in a non-volatile semiconductor memory, according to claim 6, wherein:

said data restoring operation by additional writing is conducted to all second blocks included in said first block.

37. A method of restoring data in a non-volatile semiconductor memory, according to claim 19, wherein:

said threshold voltages are set to be more than three.

38. A method of restoring data in a non-volatile semiconductor memory, according to claim 25, wherein:

said threshold voltages are set to be more than three.

39. A method of restoring data in a non-volatile semiconductor memory, according to claim 31, wherein:

said threshold voltages are set to be more than three.

40. A method of restoring data in a non-volatile semiconductor memory, according to claim 34, wherein:

said threshold voltages are set to be more than three.

* * * * *